(12) United States Patent
Schelling (10) Patent No.: US 10,988,373 B2
(45) Date of Patent: Apr. 27, 2021

(54) MEMS COMPONENT HAVING LOW-RESISTANCE WIRING AND METHOD FOR MANUFACTURING IT

(71) Applicant: Robert Bosch GmbH, Stuttgart (DE)

(72) Inventor: Christoph Schelling, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 15/807,811

(22) Filed: Nov. 9, 2017

(65) Prior Publication Data

US 2018/0141803 A1 May 24, 2018

(30) Foreign Application Priority Data

Nov. 23, 2016 (DE) .......................... 102016223203.7

(51) Int. Cl.
*B81B 7/00* (2006.01)
*B81C 1/00* (2006.01)

(52) U.S. Cl.
CPC ........ *B81B 7/0006* (2013.01); *B81C 1/00095* (2013.01); *B81C 1/00301* (2013.01); *B81B 2201/0235* (2013.01); *B81B 2207/012* (2013.01); *B81C 2203/0118* (2013.01); *B81C 2203/0792* (2013.01)

(58) Field of Classification Search
None
See application file for complete search history.

(56) References Cited

U.S. PATENT DOCUMENTS

| 6,649,987 | B1* | 11/2003 | Staker | B81B 3/0086 257/417 |
|---|---|---|---|---|
| 8,710,638 | B2 | 4/2014 | Wu | |
| 8,759,926 | B2* | 6/2014 | Fujii | B81B 7/0006 257/414 |
| 9,227,841 | B2* | 1/2016 | Huang | B81B 7/0064 |
| 9,266,714 | B2* | 2/2016 | Shu | B81C 1/00261 |
| 9,522,822 | B2* | 12/2016 | Cheng | B81B 7/0041 |
| 9,682,854 | B2* | 6/2017 | Man | B81C 1/00293 |
| 10,131,540 | B2* | 11/2018 | Yu | B81C 1/0023 |
| 10,266,399 | B2* | 4/2019 | Lee | B81B 7/02 |
| 2009/0008728 | A1* | 1/2009 | Fujii | B81B 7/007 257/415 |
| 2009/0122651 | A1* | 5/2009 | Kupnik | H02N 1/008 367/181 |

(Continued)

FOREIGN PATENT DOCUMENTS

WO 2006101769 A2 9/2006

*Primary Examiner* — Zandra V Smith
*Assistant Examiner* — Lawrence C Tynes, Jr.
(74) *Attorney, Agent, or Firm* — Norton Rose Fulbright US LLP; Gerard Messina (57) ABSTRACT

A MEMS component including a first substrate having at least one first insulating layer and a first metallic coating on a first side; and including a second substrate having at least one second insulating layer and a second metallic coating on a second side, the second substrate including a micromechanical functional element, which is connected electroconductively to the second metallic layer. The first side and the second side are positioned on each other, the first insulating layer and the second insulating layer being interconnected, and the first metallic coating and the second metallic coating being interconnected. A method for manufacturing a MEMS component is also described.

8 Claims, 9 Drawing Sheets

(56) References Cited

U.S. PATENT DOCUMENTS

| | | | | |
|---|---|---|---|---|
| 2009/0261430 | A1* | 10/2009 | Suzuki | G01C 19/56 257/417 |
| 2011/0227174 | A1* | 9/2011 | Fujii | B81B 7/0006 257/415 |
| 2015/0243611 | A1* | 8/2015 | Liu | H01L 25/0657 257/751 |
| 2015/0329353 | A1* | 11/2015 | Cheng | B81B 7/0077 257/415 |
| 2015/0375994 | A1* | 12/2015 | Chien | B81C 1/00238 257/43 |
| 2016/0130137 | A1* | 5/2016 | Huang | B81C 1/00285 257/415 |

\* cited by examiner

MEMS COMPONENT HAVING LOW-RESISTANCE WIRING AND METHOD FOR MANUFACTURING IT

CROSS REFERENCE

The present application claims the benefit under 35 U.S.C. § 119 of German Patent No. DE 102016223203.7 filed on Nov. 23, 2016, which is expressly incorporated herein by reference in its entirety.

BACKGROUND INFORMATION

The present invention relates to a MEMS component including a first substrate having at least one insulating layer and a first metallic coating on a first side; and including a second substrate having at least one second insulating layer and a second metallic coating on a second side, the second substrate including a micromechanical functional element, which is connected electroconductively to the second metallic coating.

A MEMS substrate, for example, is adhesively bonded onto an ASIC substrate. Exposed contact surfaces of the MEMS substrate are connected electroconductively to exposed contact surfaces of the ASIC substrate, using wire bonds.

Conventional micromechanical sensors, such as inertial sensors including capacitive conversion, require a wiring plane for contacting different transducer elements.

In the process sequence, due to the necessity of patterning and exposing the micromechanical structure, the micromechanical functional layer of discrete MEMS sensors is mostly prepared after the wiring plane. The micromechanical functional layers are mostly made of silicon, which is deposited at high 29203775.1 temperatures for economic reasons and is present in unstressed form over temperature. The high temperatures>1000° C. necessary for depositing silicon prevent the use of highly conductive materials, such as Cu, for the wiring layer (outdiffusion, system contamination). Instead, higher-resistance polysilicon layers are used, which results in higher RC constants.

In the area of consumer goods, MEMS sensors are frequently integrated onto or with ASIC's in a hybrid manner. At or below a node size of approximately 180 nm, modern ASIC processes only use metallic Cu coatings. In the related art, several conventional approaches, for example, as described in PCT Application No. WO2006101769A2 and U.S. Pat. No. 8,710,638 B2, integrate a MEMS component directly on a circuit substrate.

However, these approaches have the following disadvantages: (i) They are not compatible with the Cu wiring planes in modern circuit processes and/or require additional processing steps and/or (ii) they possess a vertical electrode distance, which has a large tolerance and/or (iii) for the substrate bonding, they require process temperatures greater than 400° C. and locally high mechanical contact pressure, which is not unproblematic for the modern ASIC layers.

SUMMARY

An object of the present invention is to provide a micromechanical component having low RC constants, as well as a cost-effective method for manufacturing it, which is also compatible with modern ASIC processes.

The present invention starts out from a MEMS component including a first substrate having at least one first insulating layer and a first metallic coating on a first side; and including a second substrate having at least one second insulating layer and a second metallic coating on a second side, the second substrate including a micromechanical functional element, which is connected electroconductively to the second metallic coating.

In accordance with the present invention, the first side and the second side are positioned on each other, the first insulating layer and the second insulating layer being interconnected, and the first metallic coating and the second metallic coating being interconnected. Together, the first metallic coating and the second metallic coating advantageously form a low-resistance wiring of the MEMS component.

One advantageous refinement of the MEMS component of the present invention provides for the first metallic coating and the second metallic coating to be interconnected integrally.

One advantageous refinement of the MEMS component of the present invention provides for the first metallic coating and the second metallic coating to form, in particular, a hermetically sealed, first bonding frame.

One advantageous refinement of the MEMS component of the present invention provides for the first metallic coating or also the second metallic coating to include copper.

One advantageous refinement of the MEMS component of the present invention provides for electrodes to be formed in the second metallic coating, in particular, vertical electrodes, which lie opposite to the functional element at an electrode distance; and for the electrodes to be electrically contactable from outside via the first metallic coating.

One advantageous refinement of the MEMS component of the present invention provides for doping or also piezoresistors to be introduced locally into the second substrate.

One advantageous refinement of the MEMS component of the present invention provides for the second substrate to be connected to a third substrate, in particular, via a second bonding frame, in such a manner, that the second substrate is situated between the first substrate and the third substrate.

One advantageous refinement of the MEMS component of the present invention provides that the first substrate or also the third substrate be a silicon substrate or a glass substrate.

One advantageous refinement of the MEMS component of the present invention provides that the first substrate or also the third substrate be a circuit substrate, in particular, an ASIC.

The present invention also relates to a method for manufacturing a MEMS component, including the steps:
a) Providing a first substrate having at least one first insulating layer on a first side, and having at least one first metallic coating at least partially exposed on the first side; and providing a second substrate having at least one second insulating layer on a second side, and having at least one second metallic coating at least partially exposed on the second side.
b) Wafer-bonding the first substrate and the second substrate in a hybrid manner by placing the first side and the second side on each other, joining them at a first process temperature of typically T1<200° C. and waiting for a first duration t1 of, for example, <1 h to connect the first and second insulating layers, and subsequently heating them up to a second process temperature of typically 200° C.<T2<400° C. and waiting for a second duration t2 of, for example, <1 h to connect the first and second metallic coatings.
c) Patterning the second substrate to produce a micromechanical functional element.

One advantageous refinement of the method provides that, prior to step (b), a subsection of the first insulating layers or also of the second insulating layers be removed by an etching step.

One advantageous refinement of the method provides that, after step (b), the second substrate be additionally thinned.

One advantageous refinement of the method provides that, after step (c), the micromechanical functional element be at least partially exposed by etching the second insulating layer.

One advantageous refinement of the method provides for the second substrate to be joined to a third substrate, in particular, by a second bonding frame, the second substrate being situated between the first substrate and the third substrate.

The use of the process of the present invention and, in particular, the hybrid bonding process for joining the first and second substrates, in which both the dielectric and metallic surfaces are joined to one another, has the following advantages:

- It is compatible with the conventional Cu wiring processes in modern circuit processes (so-called Cu-damascene processes), consequently permits direct piggyback integration on the evaluating ASIC and thereby renders chip-scale packages possible.
- It provides simultaneously a mechanical and electrical connection via the bonding interface.
- Very small alignment tolerances and, consequently, fine-pitch contacting between the two substrates are feasible, since (i) the hybrid bonding process does not take place via liquid phases, such as described, for instance, in PCT Application WO2006101769A2, and/or (ii) requires the subsequent contacting after the bonding process with corresponding, large tolerances in lithography and etching, as described in U.S. Pat. No. 8,710,638 B2.
- no additional structures, such as trenches for collecting eutectic or spacer structures for setting a gap, are necessary, which permits smaller designs and fewer process steps.
- At the same time, in contrast to the documents from the related art, it is possible to produce a hermetically sealed, peripheral metallic bonding frame. (Metallic layers are more gas-tight than dielectric layers, such as $SiO_2$.)
- The vertical electrode distance between the micromechanical functional element and the second metallic coating may be set comparatively precisely, since it only results from the deposited layer thickness of the second insulating layer, and not from a process chain of several layer depositions and bonding material clinchings (cf. WO2006101769A2, FIG. 1).
- No vacuum is enclosed, which, after the thinning of the second substrate, either results in deformation of the second substrate during subsequent process steps and consequently requires either greater tolerances in subsequent lithography steps or some extra process steps for opening rear ventilation holes to prevent enclosure of a vacuum.
- The necessary process temperatures do not exceed the critical threshold of 400° C., and the mechanical contact pressure is applied uniformly over the entire interface, which prevents local mechanical stress peaks in the ASIC layer architecture (cf. PCT Application No. WO 2006101769A2 and U.S. Pat. No. 8,710,638 B2).
- The method of the present invention eliminates process steps, which require the etching and filling of contact holes having high aspect ratios (U.S. Pat. No. 8,710,638 B2).
- The method of the present invention allows a monocrystalline functional layer having particularly well-defined mechanical features to be prepared.

DETAILED DESCRIPTION OF EXAMPLE EMBODIMENTS

Precise and cost-effective MEMS components require the preparation of well-defined functional layers having tight tolerances and small manufacturing variations. This may be best achieved, using monocrystalline mechanical functional materials. At the same time, RC constants that are as small as possible are desired, in order to obtain small parasitic effects (e.g., ratio of measuring capacitance to parasitic capacitance) and low signal distortions (e.g., control signals and also detection signals). This may be implemented most effectively, using metallic leads and, possibly, through piggyback integration onto the evaluating ASIC.

According to the present invention, monocrystalline micromechanical functional layers on metallic conducting wires along with an electrical connection to them may be prepared by hybrid, direct bonding processes with subsequent patterning and undercutting of the functional layer. Also, there is the additional option of introducing doping for, e.g., piezoresistors, into the monocrystalline functional layer prior to depositing the insulating layers and metallic coatings. Piezoresistors in polycrystalline functional layers would generate noise overly intensely and are therefore, as a rule, not used.

Figure 1:
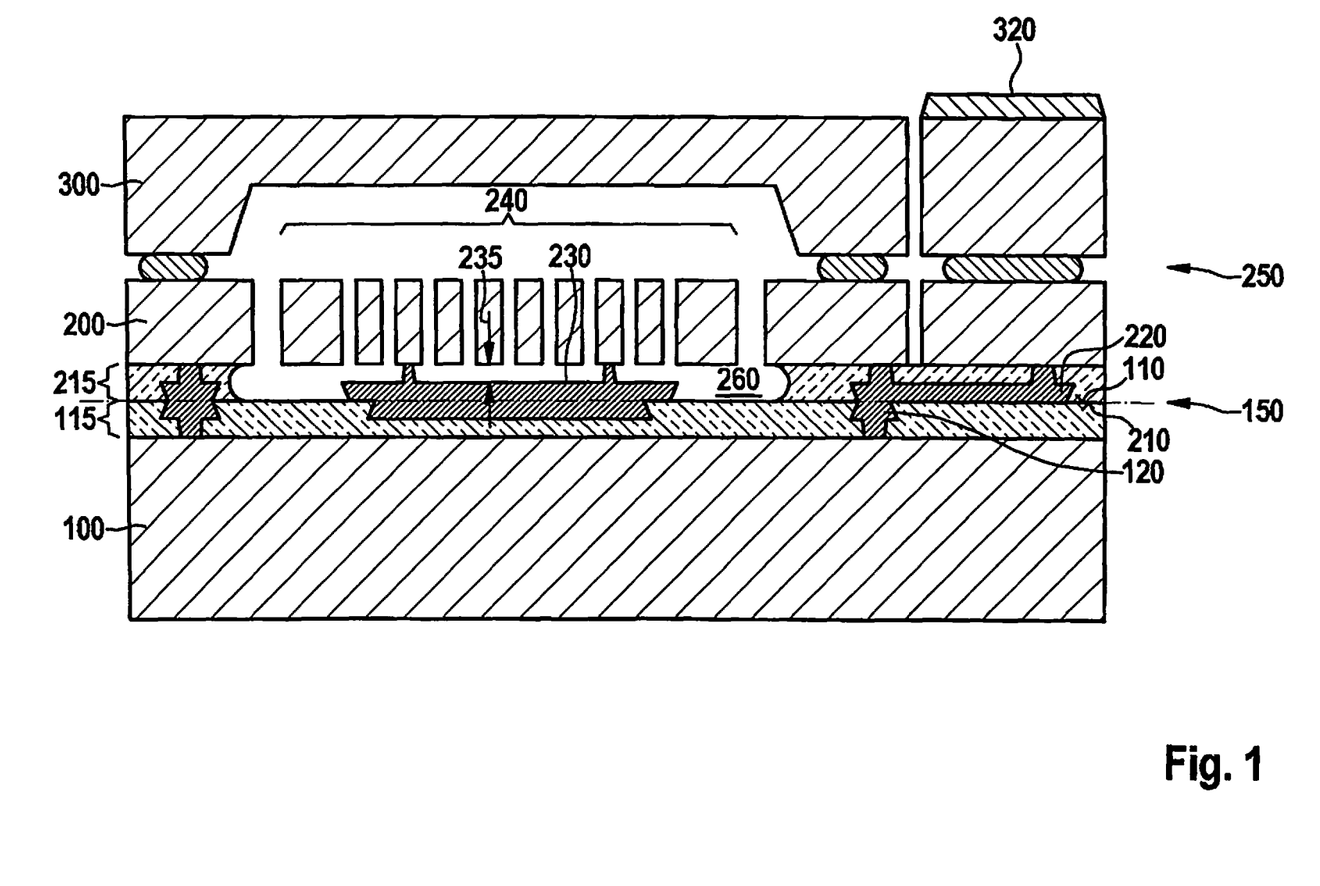
FIG. 1 shows a first exemplary embodiment of a MEMS component of the present invention, having low-resistance wiring.

FIG. 1 shows a first exemplary embodiment of a discrete MEMS component of the present invention, having low-resistance wiring. A cross section of a discrete inertial component is schematically represented. The micromechanical component is made up of a first substrate 100 having a first metallic coating 120 on a first side 110, and a second doped, thinned, patterned, and partially undercut substrate 200, which is used as a mechanical functional layer and has a second metallic coating 220 on a second side 210. First metallic coating 120 and second metallic coating 220 are interconnected mechanically and electrically.

First and second metallic coatings 120, 220 are mainly copper (Cu). Vertical electrodes 230, which are connected to the outside via first metallic coating 120, are formed in second metallic coating 220. Vertical electrodes 230 are situated oppositely to micromechanical functional element

240 at an electrode distance 235. In this context, electrode distance 235 is determined by the layer thickness of a second insulating layer 215 locally removed here. In the area, the second insulating layer is removed by undercutting 260, which also allows micromechanical functional elements 240 to move.

The two metallic coatings 120, 220 form a first bonding frame 150, which runs completely around the component and hermetically seals micromechanical functional element 240 from the outside. Parts of second substrate 200, in particular, micromechanical functional element 240, are hermetically encapsulated between first substrate 100 and a third substrate 300 in the form of a cap wafer. In this context, third substrate 300 is bonded onto second substrate 200 with the aid of a second bonding frame 250. Local doping or also piezoresistors may be introduced into second substrate 200. First substrate 100 or also optional third substrate 300 may be made of a semiconductor material or glass. The component may be contacted externally through the third substrate, which is possibly highly doped. The analog sensor signal is then carried to the evaluation circuit via a third metallic coating 320, in particular, a bonding-pad metallic coating, and a bonding-wire connection.

Figure 2:
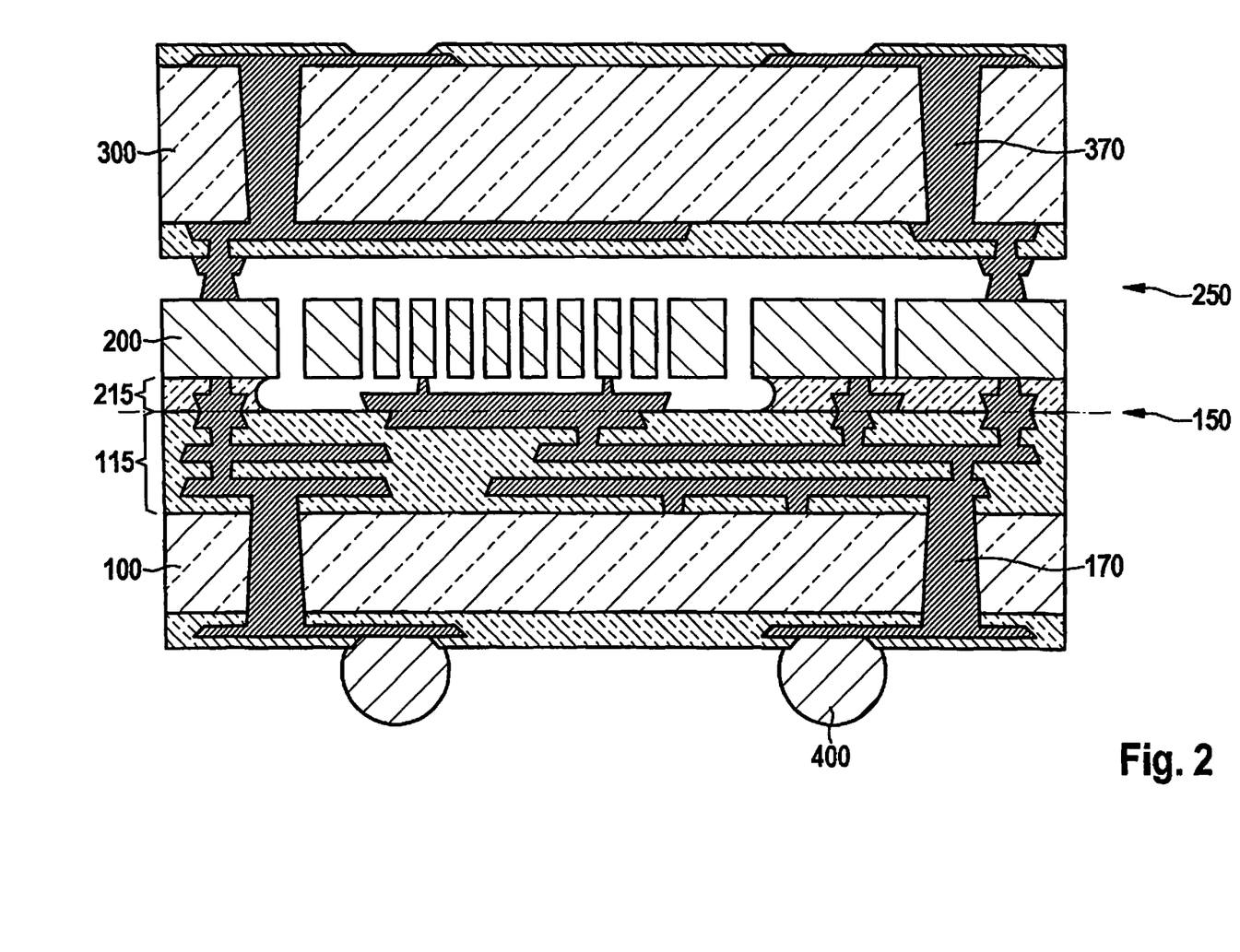
FIG. 2 shows a second exemplary embodiment of a MEMS component of the present invention, having low-resistance wiring.

FIG. 2 shows a second exemplary embodiment of a discrete MEMS component of the present invention, having low-resistance wiring. A discrete inertial component capable of being plated-through is schematically represented. An advantage of the glass wafers are the attainable, low parasitic capacitances of the plated-through holes, so-called through-glass vias (TGV's), in comparison with plated-through holes through silicon wafers, so-called through-silicon vias (TGV's). The TGV's provide the advantage that the inertial component flip chip may be mounted on a carrier. A wire bond is no longer necessary. In this case, first substrate 100 is a glass substrate having first plated-through holes 170 in the form of through-glass vias. Here, third substrate 300 is also a glass substrate having second plated-through holes 370 in the form of through-glass vias. The micromechanical component has a plurality of first insulating layers 115 and second insulating layers 215. In this manner, a plurality of wiring planes and a three-dimensional form of first metallic coating 120 and second metallic coating 220 are rendered possible. External contacting options in the form of solder balls 400 are electroconductively connected to first metallic coating 120 with the aid of first plated-through holes 170.

Figure 3:
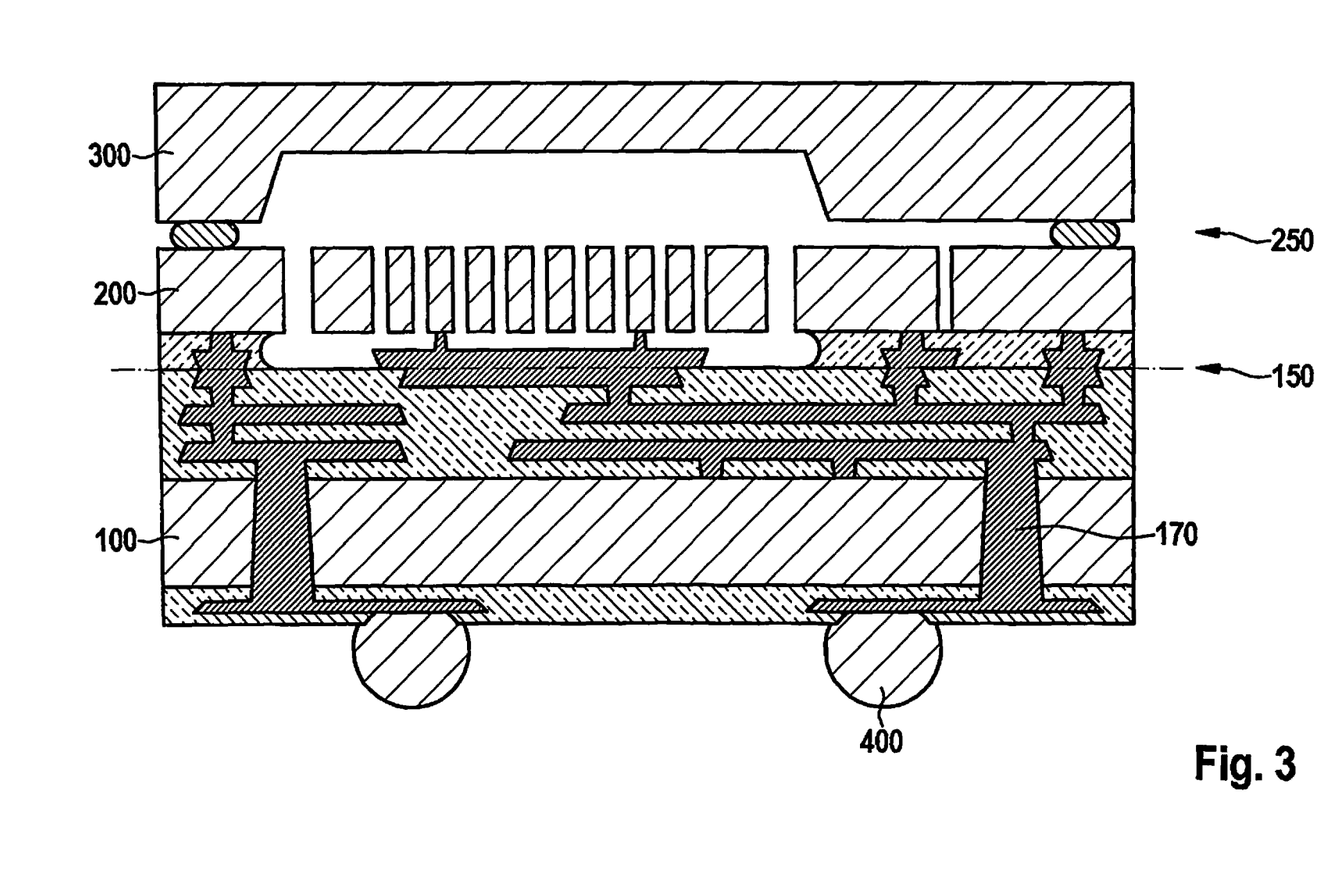
FIG. 3 shows a third exemplary embodiment of a MEMS component of the present invention, having low-resistance wiring.

FIG. 3 shows a third exemplary embodiment of a CSP MEMS component of the present invention, having low-resistance wiring. A cross section of a hybrid-integrated inertial component is schematically represented. In this context, in contrast to the discrete inertial components from FIGS. 1 and 2, the evaluation circuit necessary for conditioning the raw measured values is integrated directly into the first substrate. Thus, the inertial component is directly able to output evaluated measuring signals. This hybrid-integrated assembly provides the advantage that the two components, MEMS and evaluation circuit, may be integrated together on the wafer level in a cost-effective manner, without a packaging step, such as extrusion-coating with a molding compound, being necessary. As a result, one simultaneously obtains the smallest conceivable inertial component. However, in the case of the discrete design approaches from FIGS. 1 and 2, another markedly more cost-intensive assembly, connecting and packaging technique is necessary on the chip level.

Figure 4:
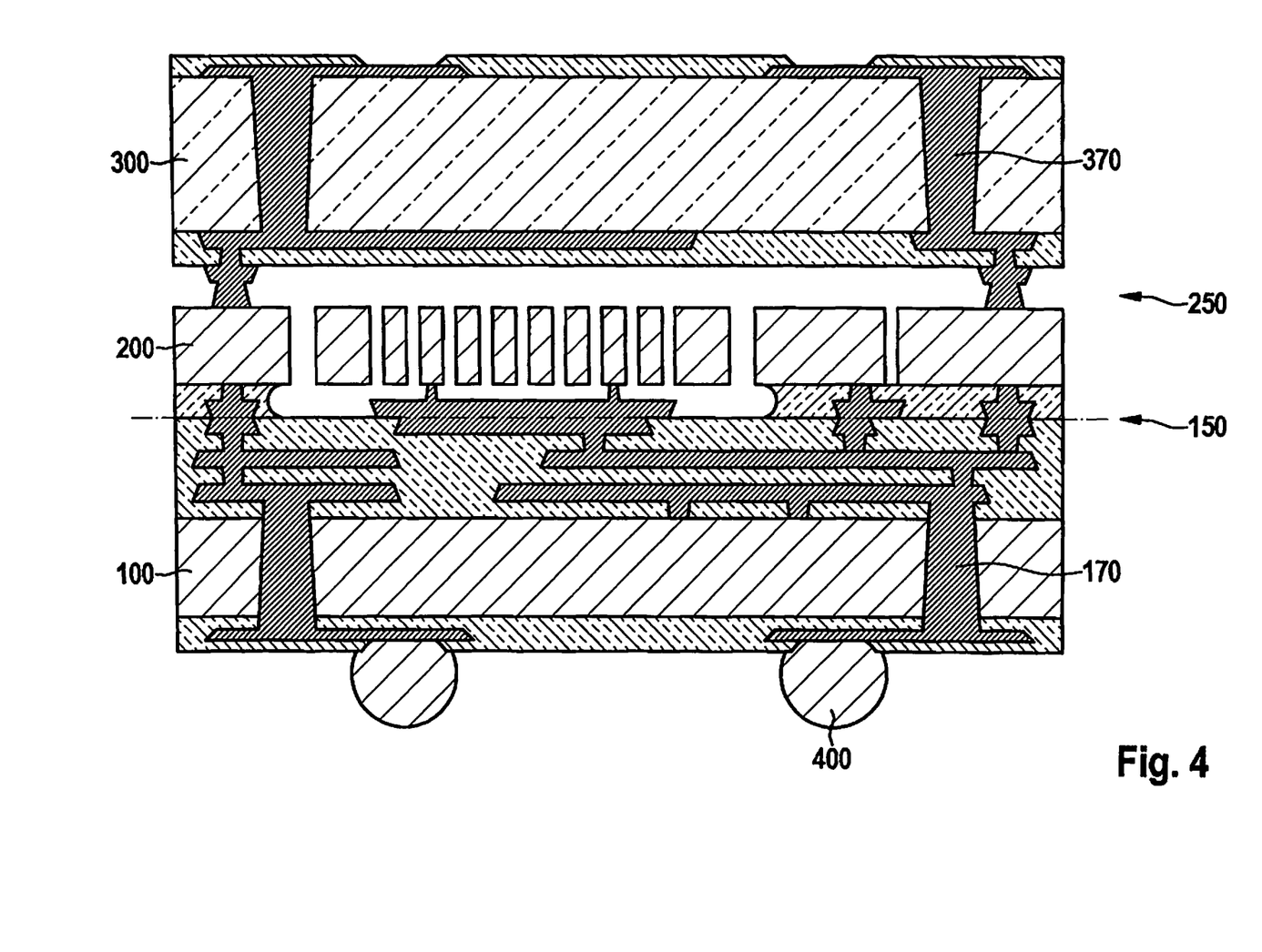
FIG. 4 shows a fourth exemplary embodiment of a MEMS component of the present invention, having low-resistance wiring.

FIG. 4 shows a fourth exemplary embodiment of a further CSP MEMS component of the present invention, having low-resistance wiring. A cross-section of a hybrid-integrated inertial component is schematically represented. The component distinguishes itself in that, in particular, it has plated-through electrical contacts from the second, external side of the first substrate, through the second and the third substrates, to the external side of the third substrate. Using this design, it is simple to integrate further functions, such as a magnetic field sensor, into the component in a piggyback manner.

FIGS. 5A through E show a method of the present invention for manufacturing a MEMS component having low-resistance wiring. In each instance, a cross section of an exemplary CSP component (CSP: chip scale package) after different stages of the manufacturing process is schematically represented.

Figure 5A:
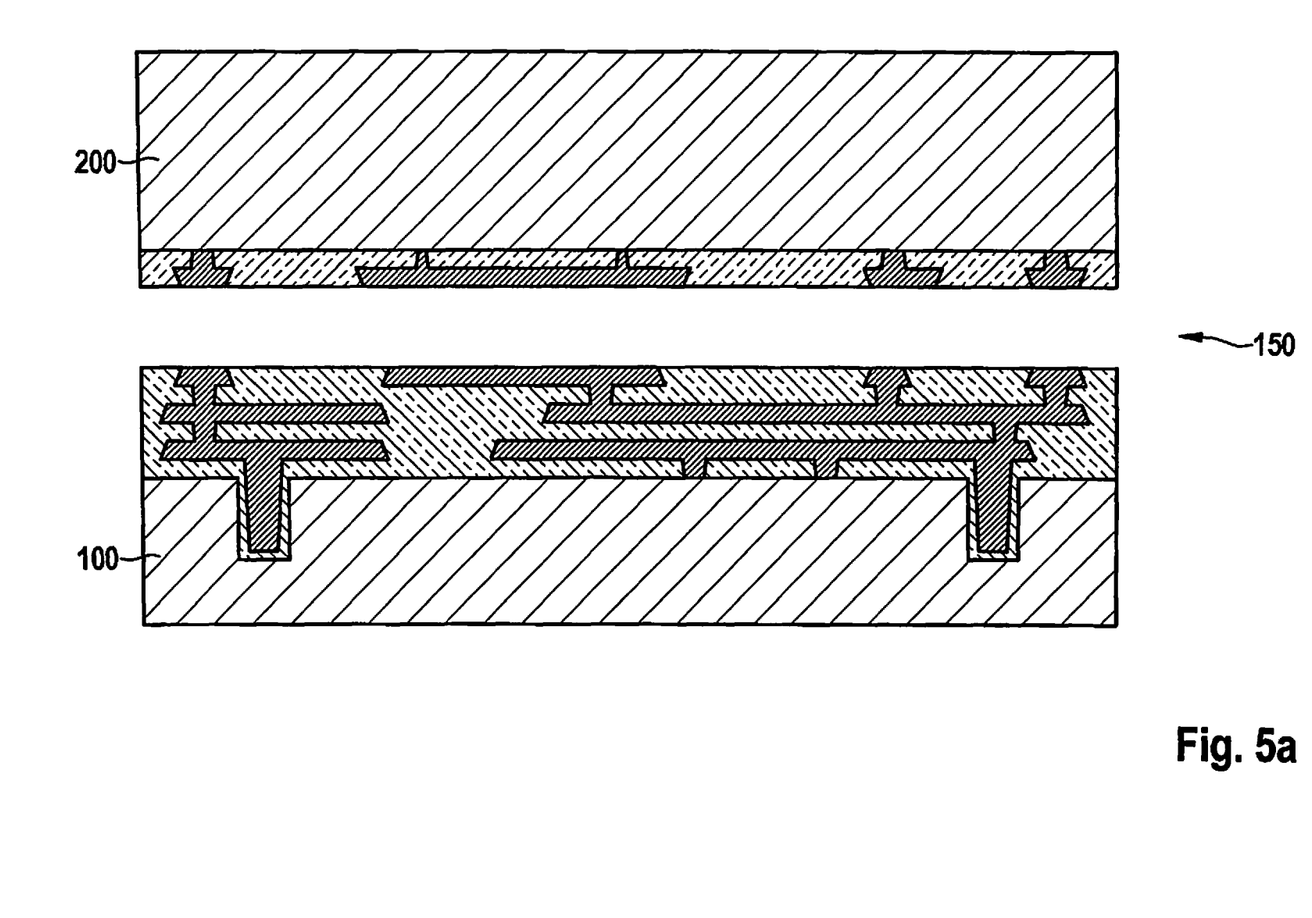
FIGS. 5A through E show a method of the present invention for manufacturing a MEMS component having low-resistance wiring.

In a first step a), FIG. 5A shows the provision of a first planarized (ASIC) substrate having insulating layers and at least one at least partially exposed, metallic coating. In the first substrate, TSV's were already deposited during the preceding circuit process. A second planarized substrate having insulating layers and a second, at least partially exposed, metallic coating are also provided. As an option, the insulating layer in the region intended for the free-moving micromechanical functional elements to be patterned later out of the mechanical functional layer may be locally removed, using an etching step.

Figure 5B:
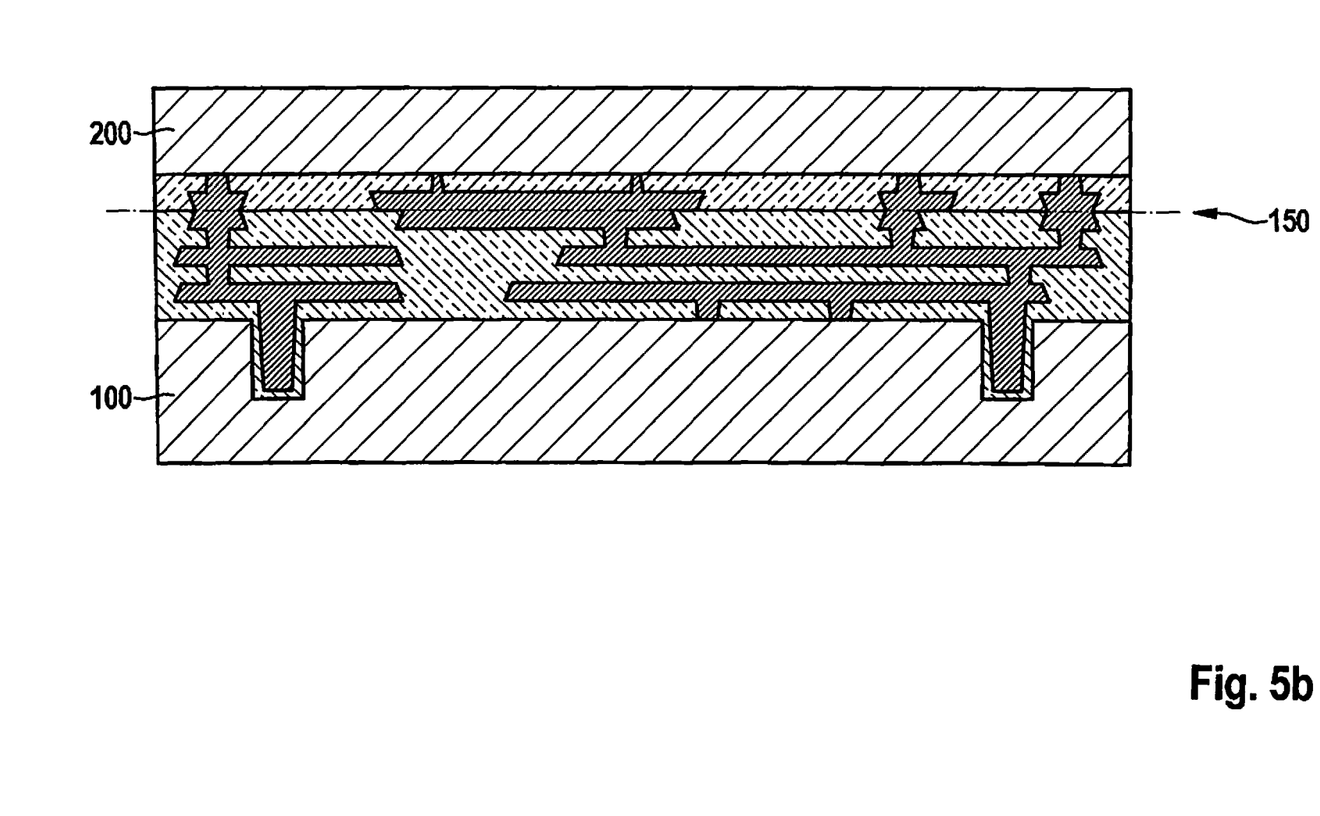

In a step b), FIG. 5B shows the hybrid wafer bonding of the two substrates onto each other by joining them under mechanical contact pressure at a first process temperature T1<200° C. and waiting for a duration t1<1 h to join the insulating layers, and by subsequently heating them up to a second process temperature 200° C.<T2<400° C. and waiting for a duration t2<1 h to join the metallic layers. As an option, the second substrate may also be thinned to the desired thickness of the micromechanical functional layer. In this manner, a monocrystalline micromechanical functional layer is prepared.

Figure 5C:
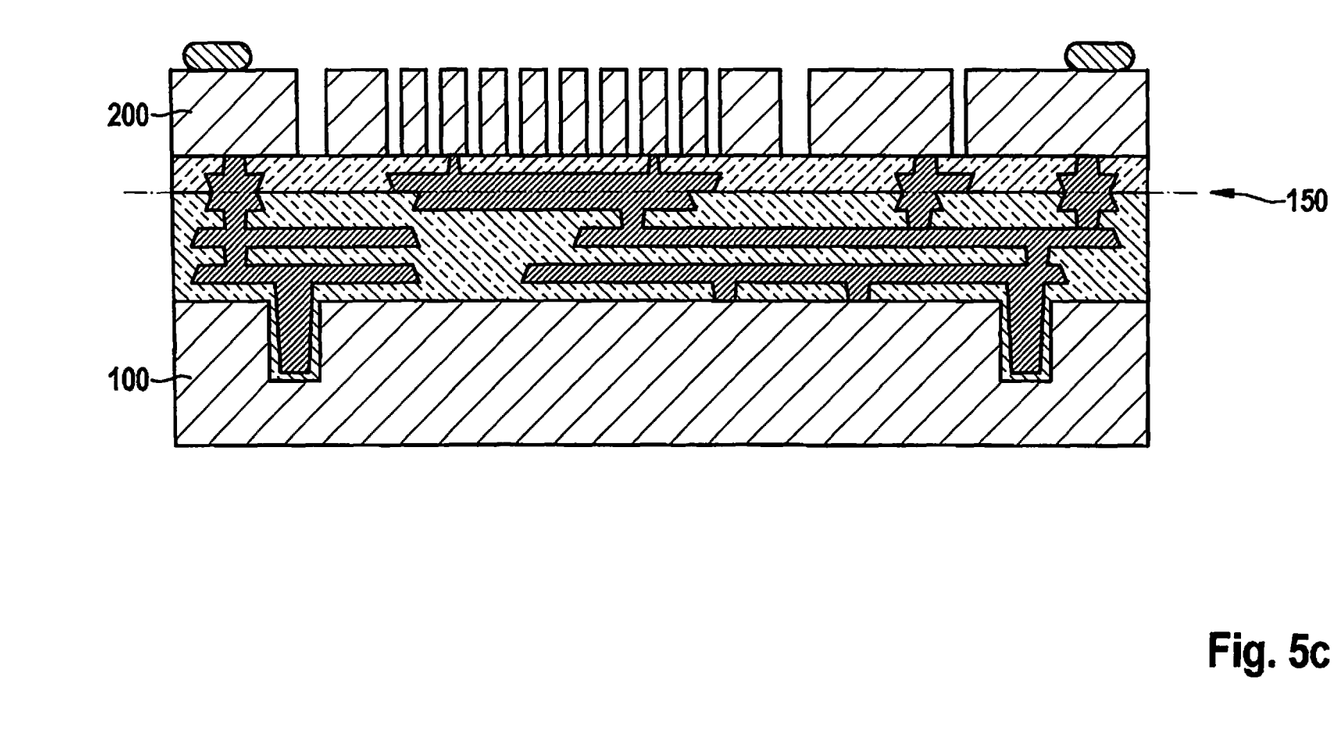

In a step c), FIG. 5c shows the optional deposition of a bonding material for the, e.g., eutectic wafer-bonding of a third substrate 300, in particular, a cap. Subsequently, second substrate 200 is patterned down to nearest, second insulating layer 215. In this example, the patterning is carried out, using DRIE-etching. In this instance, second insulating layer 215 is used as an etch-stop layer. A micromechanical functional layer 240 is laid out with the aid of the patterning.

Figure 5D:
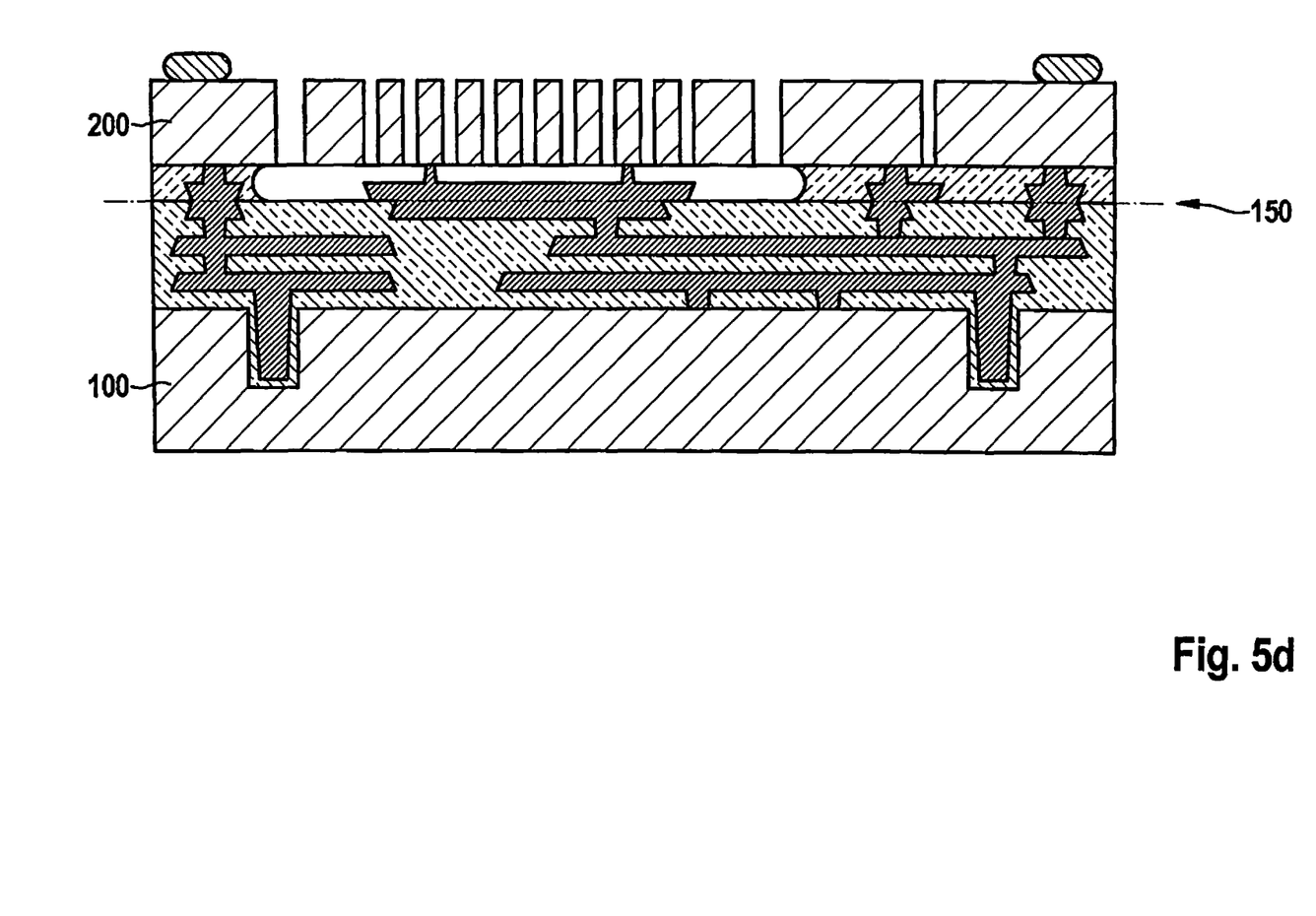

In a step d), FIG. 5D shows the undercutting or exposure of movable micromechanical functional elements. This may be implemented, for example, using HF gas-phase etching.

Figure 5E:
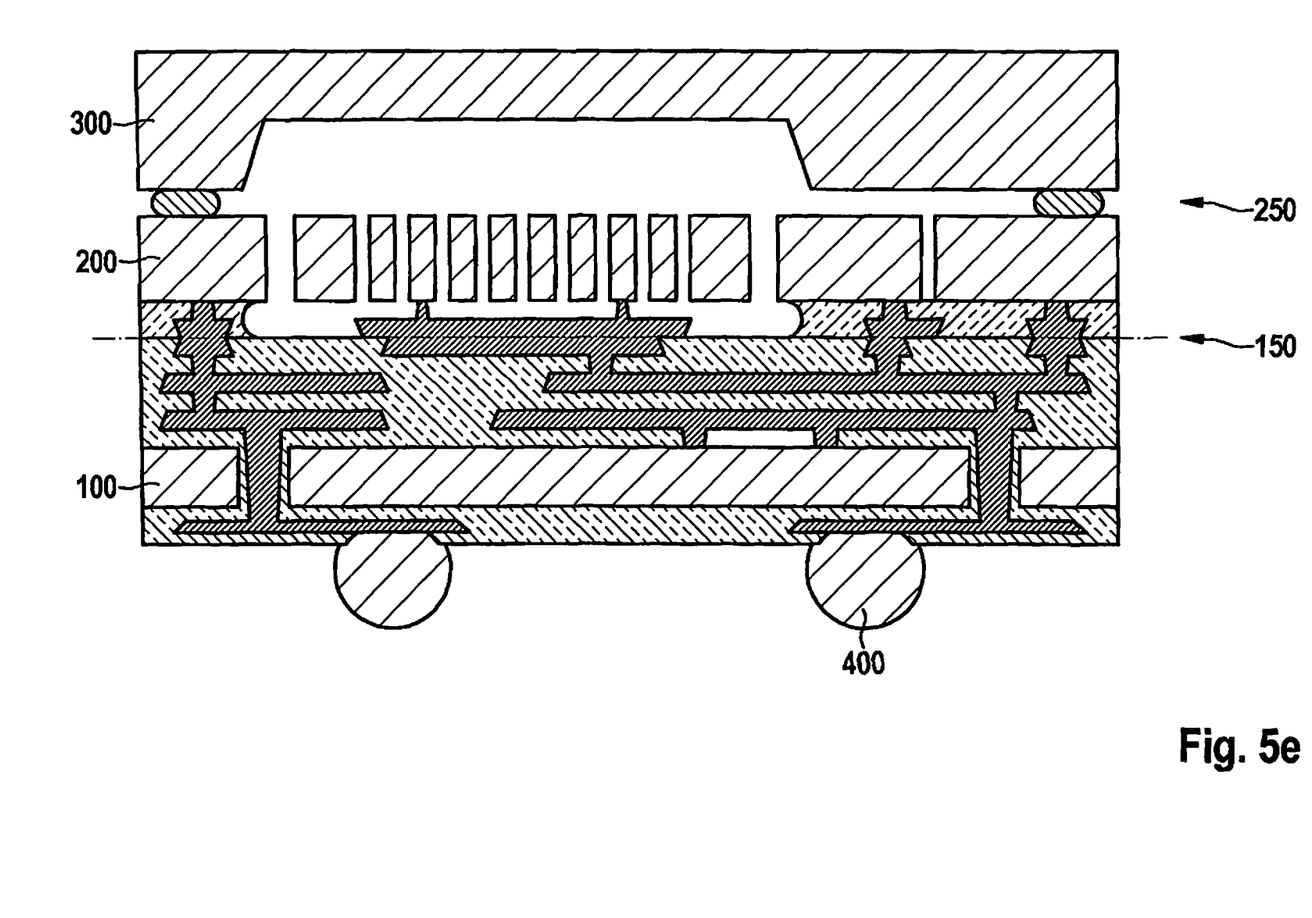

In a step e), FIG. 5E shows the optional joining of the composite of the first and second substrates to a provided, third (cap) substrate, on which a second bonding material is optionally situated. The cap substrate is joined, using a wafer-level bonding process, e.g., eutectic Al—Ge wafer bonding, at a set, desired gas pressure and in a selected gas atmosphere. A bonding frame encircling the micromechanical functional elements ensures that the gas pressure remains hermetically sealed in over the service life. After that, the TSV's laid out in the first (ASIC) substrate may be exposed ("TSV Reveal") by removing the substrate material. Subsequently, an RDL (redistribution layer) wiring plane solderable, e.g., using nickel, is applied and connected to the TSV's. Finally, passivation is deposited, and openings to the RDL wiring are produced, and solder balls are deposited.

LIST OF REFERENCE SYMBOLS

100 first substrate
110 first side 115 first insulating layers
120 first metallic coating
150 first bonding frame
170 first plated-through holes (e.g., through-glass vias, TGV)
200 second substrate
210 second side
215 second insulating layers
220 second metallic coating
230 vertical electrodes
235 electrode distance
240 micromechanical functional element
250 second bonding frame
260 undercutting
300 third substrate
320 third metallic coating (e.g., bonding-pad metallic coating)
370 second plated-through holes (e.g., through-glass vias, TGV)
400 solder balls
T1 first process temperature
T2 second process temperature
t1 first duration
t2 second duration

What is claimed is:

1. A MEMS component, comprising: a first substrate having at least one first insulating layer and a first metallic coating on a first side; and a second substrate having at least one second insulating layer and a second metallic coating on a second side, the second substrate including a micromechanical functional element, which is connected electroconductively to the second metallic coating; a hybrid bond connection between the first substrate and the second substrate, wherein the first side and the second side are positioned on each other, the first insulating layer and the second insulating layer being interconnected, and the first metallic coating and the second metallic coating being interconnected mechanically and electrically, wherein vertical electrodes, which are situated oppositely to the micromechanical functional element at an electrode distance determined solely by a layer thickness of the second insulating layer locally removed between the vertical electrodes and the micromechanical functional element, are formed in the second metallic coating, and the electrodes are externally contactable with the aid of the first metallic coating.

2. The MEMS component as recited in claim 1, wherein the first metallic coating and the second metallic coating are integrally connected to one another.

3. The MEMS component as recited in claim 2, wherein the first metallic coating and the second metallic coating form a hermetically sealed, first bonding frame.

4. The MEMS component as recited in claim 1, wherein at least one of the first metallic coating and the second metallic coating include copper.

5. The MEMS component as recited in claim 1, wherein at least one of local doping and piezoresistors, are introduced into the second substrate.

6. The MEMS component as recited in claim 1, wherein the second substrate is connected to a third substrate via a second bonding frame in such a manner that the second substrate is situated between the first substrate and the third substrate.

7. The MEMS component as recited in claim 1, wherein at least one of the first substrate an the third substrate is an ASIC.

8. The MEMS component as recited in claim 1, wherein at least one of the first substrate and the third substrate is a silicon substrate or a glass substrate.

* * * * *